United States Patent
Qian et al.

(10) Patent No.: US 9,002,302 B1
(45) Date of Patent: *Apr. 7, 2015

(54) DIGITAL PREDISTORTION FOR NONLINEAR RF POWER AMPLIFIERS

(71) Applicant: Marvell International Ltd., Hamilton (BM)

(72) Inventors: Hua Qian, Fremont, CA (US); Songping Wu, Cupertino, CA (US); Daxiao Yu, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/953,060

(22) Filed: Jul. 29, 2013

Related U.S. Application Data (63) Continuation of application No. 12/860,108, filed on Aug. 20, 2010, now Pat. No. 8,498,591.

(60) Provisional application No. 61/236,038, filed on Aug. 21, 2009.

(51) Int. Cl.
- H04B 1/04 (2006.01)
- H03C 1/62 (2006.01)
- H04L 1/00 (2006.01)

(52) U.S. Cl.
CPC .................................... H04L 1/0035 (2013.01)

(58) Field of Classification Search
CPC ... H03F 1/3233; H03F 1/3241; H03F 1/3247; H04B 1/0475; H04B 1/62; H04B 2001/0425; H04B 2001/0433; H04L 27/368
USPC ................. 455/63.1, 67.11, 67.13, 69, 114.3, 455/115.1; 375/296, 297; 330/127, 136, 330/149
See application file for complete search history.

(56) References Cited

U.S. PATENT DOCUMENTS

| | | | |
|---|---|---|---|
| 4,291,277 A | 9/1981 | Davis et al. | |
| 4,967,164 A | 10/1990 | Sari | |

(Continued)

FOREIGN PATENT DOCUMENTS

| | | |
|---|---|---|
| EP | 380167 B1 | 8/1994 |
| EP | 387948 B1 | 8/1994 |

(Continued)

OTHER PUBLICATIONS

"DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band", IEEE 802.11g, 2003, 69 pages.

Andreani, P., et al., Chip for Wideband Digital Predistorion RF Power Amplifier Linearization, Electronics Letters, May 22, 1997, pp. 925-926, vol. 33, No. 11, IEEE, 2 pages.

ANSI/IEEE, Std. 802.11, 1999 Edition, Part 11: Wireless LAN Medium Access Control (MAC) and Physical Layer (pHY) Specifications, Aug. 20, 1999, IEEE, 531 pages.

(Continued)

*Primary Examiner* — Quochien B Vuong (57) ABSTRACT

Systems and techniques relating to wireless communications are described. A described technique includes operating a device, that includes a receive filter, in different modes comprising an operational mode and a predistortion training mode, where the receive filter is configured to operate at a first bandwidth during the operational mode and operate at a second, wider bandwidth during the predistortion training mode; generating a digital transmit signal; receiving a digital receive signal via the receive filter, causing, in the predistortion training mode, the digital receive signal to be based on an amplified analog version of the digital transmit signal, the amplified analog version being produced by a power amplifier having a nonlinear characteristic(s); estimating predistortion parameter value(s) using samples of the digital transmit signal and samples of the digital receive signal; and using the predistortion parameter value(s) to predistort digital signals to compensate for the nonlinear characteristic(s) of the power amplifier.

20 Claims, 8 Drawing Sheets

(56) References Cited

U.S. PATENT DOCUMENTS

| | | | |
|---|---|---|---|
| 5,049,832 | A | 9/1991 | Cavers |
| 5,107,520 | A | 4/1992 | Karam et al. |
| 5,148,448 | A | 9/1992 | Karam et al. |
| 5,253,272 | A | 10/1993 | Jaeger et al. |
| 5,486,789 | A | 1/1996 | Palandech et al. |
| 5,760,646 | A | 6/1998 | Belcher et al. |
| 5,892,397 | A | 4/1999 | Belcher et al. |
| 5,905,760 | A | 5/1999 | Schnabl et al. |
| 5,910,965 | A | 6/1999 | Ierfino et al. |
| 5,929,703 | A | 7/1999 | Sehier et al. |
| 5,949,283 | A | 9/1999 | Proctor et al. |
| 5,959,499 | A * | 9/1999 | Khan et al. .................... 330/149 |
| 6,072,364 | A | 6/2000 | Jeckeln et al. |
| 6,075,411 | A | 6/2000 | Briffa et al. |
| 6,078,216 | A | 6/2000 | Proctor |
| 6,108,385 | A | 8/2000 | Worley |
| 6,118,335 | A | 9/2000 | Nielsen et al. |
| 6,194,964 | B1 | 2/2001 | Jun |
| 6,236,837 | B1 | 5/2001 | Midya |
| 6,240,144 | B1 | 5/2001 | Ha |
| 6,240,278 | B1 | 5/2001 | Midya et al. |
| 6,252,912 | B1 | 6/2001 | Salinger |
| 6,275,685 | B1 | 8/2001 | Wessel et al. |
| 6,288,610 | B1 | 9/2001 | Miyashita |
| RE37,407 | E | 10/2001 | Eisenberg et al. |
| 6,298,096 | B1 | 10/2001 | Burgin |
| 6,298,097 | B1 | 10/2001 | Shalom |
| 6,320,463 | B1 | 11/2001 | Leva et al. |
| 6,587,514 | B1 | 7/2003 | Wright |
| 6,836,517 | B2 | 12/2004 | Nagatani et al. |
| 6,928,122 | B2 * | 8/2005 | Opas et al. .................... 375/296 |
| 6,963,242 | B2 | 11/2005 | White et al. |
| 6,985,704 | B2 | 1/2006 | Yang et al. |
| 7,058,369 | B1 | 6/2006 | Wright et al. |
| 7,071,777 | B2 | 7/2006 | McBeath et al. |
| 7,085,330 | B1 | 8/2006 | Shirali |
| 7,102,430 | B2 | 9/2006 | Johnson et al. |
| 7,184,490 | B1 | 2/2007 | Rybicki et al. |
| 7,203,247 | B2 * | 4/2007 | Bauder et al. ................. 375/296 |
| 7,289,575 | B1 | 10/2007 | Kenington |
| 7,313,199 | B2 | 12/2007 | Gupta et al. |
| 7,362,821 | B1 | 4/2008 | Shirali |
| 7,535,974 | B1 | 5/2009 | Shirali |
| 8,326,239 | B1 * | 12/2012 | Peiris et al. ................. 455/114.3 |
| 8,340,602 | B1 * | 12/2012 | Peiris et al. ................. 455/114.3 |
| 2001/0004223 | A1 | 6/2001 | Kim |
| 2002/0065048 | A1 * | 5/2002 | Nagatani et al. ................. 455/63 |
| 2008/0139141 | A1 | 6/2008 | Varghese et al. |

FOREIGN PATENT DOCUMENTS

| | | |
|---|---|---|
| WO | WO9804034 A1 | 1/1998 |
| WO | WO9828888 A1 | 7/1998 |
| WO | WO0001065 A1 | 1/2000 |
| WO | WO0215389 A1 | 2/2002 |

OTHER PUBLICATIONS

Cavers, James K., The Effect of Quadrature Modulator and Demodulator Errors on Adaptive Digital Presidtorters for Amplifier Linearization, IEEE Tranactions on Vehicular Technology, May 1997, pp. 456-466, vol. 46, No. 2, IEEE, 11 pages.

D'Andrea, Aldo N., et al. A Digital Approach to Efficient Rf Power Amplifier Linearization, Proc. of IEEE Globe COLMM '97,1997, pp. 77-81, IEEE, 3 pages.

Faulkner, Michael, et al., Adaptive Linearization Using Predistortion—Experimental Results, IEEE Transactions on Vehicular Technology, May 1994, pp. 323-332, vol.43, No. 2, IEEE, 10 pages.

IEEE Std 802.11 b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std 802.11a-1999 (Supplement to IEEE Std 802.11-1999) [Adopted by ISOIIEC and redesignated as ISOIIEC 8802-11: 1999/ Amd 1 :2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.

Information technology—Telecommunications and information exchange between systems—Local and metropolitan networks—specific requirements. Part 11: Wireless LAN Medium Access Control (MAC) and Physical Layer (PHY) Specifications, IEEE Std. 802.11n, Oct. 29, 2009, 535 pages.

Johnson, Daniel Eric, Adaptive Digital Predistortion with Applications for LMDS Systems, Aug. 25, 2000, Virginia Polytechnic Institute and State University, US, 98 pages.

Qian et al., "Digital Predistortion for Nonlinear RF Power Amplifiers," U.S. Appl. No. 12/860,108, filed Aug. 20, 2010, to be published by the USPTO, 36 pages.

Sundstrom, Lars, et al., Effects of Reconstruction Filters in Digital Predistortion Linearizers for RF Power Amplifiers, IEEE Transactions on Vehicular Technology, Feb. 1995, pp. 131 139, vol. 44, No. 1, IEEE US, 9 pages.

Sundstrom, Lars, et al., Quantization Analysis and Design of a Digital Predistortion Linearizer for RF Power Amplifiers, IEEE Transactions on Vehicular Technology, Nov. 1996, pp. 707-719, vol. 45, No. 4, IEEE, 13 pages.

Zavosh, Frank, et al., Digital Predistortion JTechniques for RF Power Amplifiers with CDMA Applications, Microwave Journal, Oct. 1999, Horizon House Publications, 9 pages.

* cited by examiner

DIGITAL PREDISTORTION FOR NONLINEAR RF POWER AMPLIFIERS

CROSS REFERENCE TO RELATED APPLICATION

This disclosure is a continuation of and claims the benefit of the priority of U.S. patent application Ser. No. 12/860,108, filed Aug. 20, 2010 and entitled "DIGITAL PREDISTORTION FOR NONLINEAR RF POWER AMPLIFIERS" (now U.S. Pat. No. 8,498,591, which claims the benefit of the priority of U.S. Provisional Application Ser. No. 61/236,038, filed Aug. 21, 2009 and entitled "Digital Predistortion for Nonlinear RF Power Amplifiers." The above-identified applications are incorporated herein by reference in their entirety.

BACKGROUND

This disclosure relates to wireless communications.

Wireless communication devices typically use power amplifiers to amplify signals prior to over the air transmission. The efficiency of a power amplifier generally impacts the performance of devices such as a mobile phone or a base station. For a mobile phone, a higher efficiency power amplifier can increase battery life. For a base station, a higher efficiency power amplifier can reduce power consumption, which results in lower operating costs. However, high efficiency power amplifiers are typically nonlinear in power output response. Nonlinear amplification may cause spectral regrowth (e.g., a transmission mask violation) and in-band distortion (e.g., error vector magnitude (EVM) degradation). Wireless communication devices can perform power amplifier linearization to cancel nonlinear characteristics of a power amplifier. Various examples of linearization include feedback, feedforward, and predistortion techniques.

Wireless communication devices can use one or more wireless communication technologies such as orthogonal frequency division multiplexing (OFDM). In an OFDM based wireless communication system, a data stream is split into multiple data substreams. Such data substreams are sent over different OFDM subcarriers, which can be referred to as tones or frequency tones. Wireless conmmunication devices can conmmunicate based on one or more wireless standards such as Worldwide Interoperability for Microwave Access (WiMAX), Bluetooth, or wireless local area network (WLAN) standards such as IEEE 802.11 standards. Various examples of wireless communication devices include mobile phones, smart phones, wireless routers, wireless hubs, base stations, and access points. In some cases, wireless communication electronics are integrated with data processing equipment such as laptops, personal digital assistants, and computers

SUMMARY

The present disclosure includes systems and techniques related to wireless communications.

According to an aspect of the described systems and techniques, a method for wireless communications includes generating a digital transmit signal, receiving a digital receive signal, storing signal samples, the signal samples including transmit samples based on the digital transmit signal and receive samples based on the digital receive signal, causing, in a predistortion training mode, the digital receive signal to be based on an amplified analog version of the digital transmit signal, where the amplified analog version is produced by a power amplifier having one or more nonlinear characteristics, determining a synchronization offset value to align the transmit samples with the receive samples, determining one or more power normalization parameter values to normalize a power of the digital receive signal with respect to the digital transmit signal, estimating predistortion parameter values, and using the predistortion parameter values to predistort digital signals to compensate for the one or more nonlinear characteristics of the power amplifier. Estimating predistortion parameter values can include using information comprising the transmit samples, the receive samples, the synchronization offset value, and the one or more power normalization parameter values.

These and other implementations can include one or more of the following features. Estimating the predistortion parameter values can include using a polynomial based nonlinear predistortion model that is linear to the predistortion parameter values. In some implementations, the transmit samples, the receive samples, and the predistortion parameter values are represented by complex numbers. Estimating the predistortion parameter values can include using a recursive estimation technique to iteratively produce updated versions of the predistortion parameter values. Implementations can include estimating updated versions of the predistortion parameter values based on a power change of the digital transmit signal. Implementations can include controlling an attenuator to attenuate the amplified analog version when the digital receive signal is based on the amplified analog version.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, one or more disclosed embodiments can be implemented in various systems and apparatus, including, but not limited to, a special purpose data processing apparatus (e.g., a wireless communication device such as a wireless access point, a remote environment monitor, a router, a switch, a computer system component, a medium access unit), a mobile data processing apparatus (e.g., a wireless client, a cellular telephone, a smart phone, a personal digital assistant (PDA), a mobile computer, a digital camera), a general purpose data processing apparatus such as a computer, or combinations of these.

Systems and apparatuses can include processor electronics configured to produce a digital transmit signal, a first convertor to convert the digital transmit signal to an analog transmit signal, a power amplifier to amplify the analog transmit signal, where the power amplifier has one or more nonlinear characteristics, receiver circuitry to receive an analog receive signal in one of an operational mode or a predistortion training mode, and a second convertor to convert the analog receive signal to a digital receive signal.

These and other implementations can include one or more of the following features. In some implementations, the processor electronics are configured to perform operations that include causing the receiver circuitry, in the predistortion training mode, to receive the amplified analog transmit signal as the analog receive signal, sampling the digital transmit signal to produce transmit samples, sampling the digital receive signal to produce receive samples, determining a synchronization offset value to align the transmit samples with the receive samples, determining one or more power normalization parameter values to normalize a power of the digital receive signal with respect to the digital transmit signal, estimating predistortion parameter values using information comprising the transmit samples, the receive samples, the synchronization offset value, and the one or more power normalization parameter values, and using the predistortion parameter values to predistort digital signals to compensate for the one or more nonlinear characteristics of the power amplifier.

Estimating the predistortion parameter values can include using a polynomial based nonlinear predistortion model that is linear to the predistortion parameter values. In some implementations, the transmit samples, the receive samples, and the predistortion parameter values are represented by complex numbers. Estimating the predistortion parameter values can include using a recursive estimation technique to iteratively produce updated versions of the predistortion parameter values. Estimating the predistortion parameter values is agnostic to one or more properties associated with the digital transmit signal. The one or more properties can include a carrier frequency. The operations further can include estimating updated versions of the predistortion parameter values based on a power change of the digital transmit signal. Implementations can include a transmit filter coupled between the first convertor and the power amplifier. In some implementations, a bandwidth of the transmit filter is at least twice that of the digital transmit signal. Implementations can include a receive filter coupled between the receiver circuitry and the second convertor. In some implementations, a bandwidth of the receiver filter is at least wide enough to pass through signals distorted by the one or more nonlinear characteristics of the power amplifier. Receiver circuitry can include an attenuator to attenuate the analog receive signal when the amplified analog transmit signal is received as the analog receive signal. Receiver circuitry can include an automatic gain controller to compensate for one or more nonlinear characteristics of the receiver circuitry.

In another aspect, systems and apparatuses can include processor electronics configured to (i) produce a digital transmit signal and (ii) receive a digital receive signal. Systems and apparatuses can include memory to store signal samples, the signal samples including (i) transmit samples based on the digital transmit signal and (ii) receive samples based on the digital receive signal.

These and other implementations can include one or more of the following features. In some implementations, the processor electronics are configured to perform operations that include causing, in a predistortion training mode, the digital receive signal to be based on an amplified analog version of the digital transmit signal, where the amplified analog version is produced by a power amplifier having one or more nonlinear characteristics. The operations can include determining a synchronization offset value to align the transmit samples with the receive samples. The operations can include determining one or more power normalization parameter values to normalize a power of the digital receive signal with respect to the digital transmit signal. The operations can include estimating predistortion parameter values using information including the transmit samples, the receive samples, the synchronization offset value, and the one or more power normalization parameter values. The operations can include using the predistortion parameter values to predistort digital signals to compensate for the one or more nonlinear characteristics of the power amplifier. The operations can include controlling an attenuator to attenuate an amplified analog version when a digital receive signal is based on the amplified analog version.

Details of one or more implementations are set forth in the accompanying drawings and the description below. Other features and advantages may be apparent from the description and drawings, and from the claims.

DRAWING DESCRIPTIONS

Like reference symbols in the various drawings indicate like elements.

DETAILED DESCRIPTION

This disclosure provides details and examples of technologies for wireless communications, including digital predistortion techniques for nonlinear power amplifiers. In various communication devices, a transmit data path and a receive data path are both present because these devices communicate with other devices by transmitting and receiving signals. As disclosed herein, digital predistortion techniques can use such receive data paths for looping back amplified transmission signals to estimate predistortion parameters that are used to cancel nonlinear characteristics introduced by signal amplification. A digital predistortion technique can be adaptive to changes of the nonlinear characteristics during operation of a wireless communication device. Various examples of wireless technology used in communication devices include WiMAX, WLAN, and Bluetooth.

Figure 1:
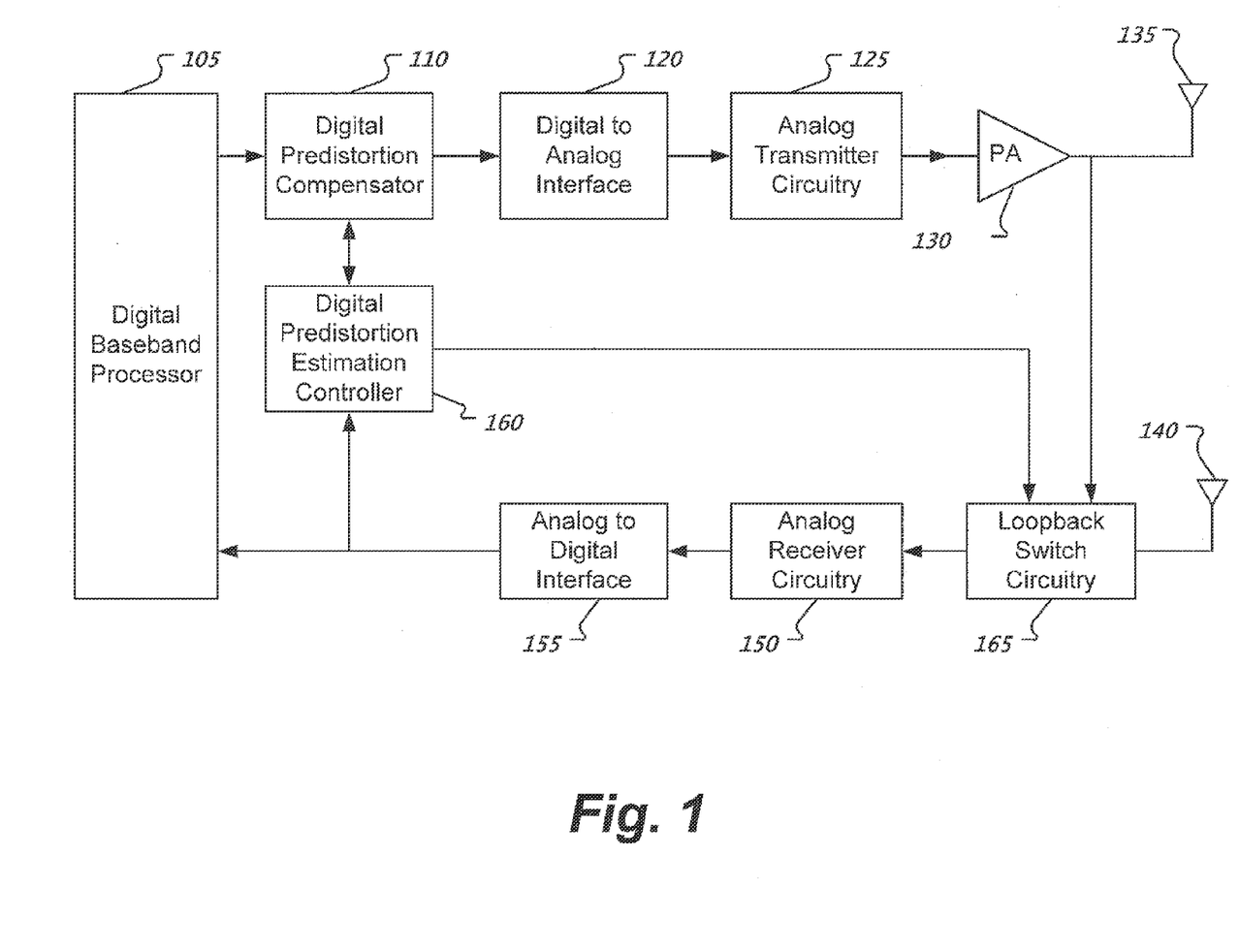
FIG. 1 shows an example of a wireless communication device architecture.

FIG. 1 shows an example of a wireless communication device architecture, which can include the various implementation details described above. A device can include a digital baseband processor 105, digital predistortion compensator 110, digital to analog interface 120, analog transmitter circuitry 125, power amplifier (PA) 130, transmit antenna 135, receive antenna 140, analog receiver circuitry 150, analog to digital interface 155, a digital predistortion estimation controller 160, and loopback switch circuitry 165.

The digital baseband processor 105 can generate data for transmission and output a digital signal. In some implementations, the digital baseband processor 105 can perform an Inverse Fast Fourier Transform (IFFT) to produce a signal based on orthogonal frequency division multiplexing (OFDM). In some implementations, the digital baseband processor 105 communicates with a host processor to receive data for transmission.

The digital to analog interface 120, e.g., a digital to analog convertor (DAC), converts a digital signal into an analog signal. The analog transmitter circuitry 125 receives an analog signal from the digital to analog interface 120. The analog transmitter circuitry 125 can include modulation circuitry (not shown). In some implementations, the modulation circuitry is driven by an oscillator that is tuned to a carrier frequency, to up-convert a baseband analog signal. The power amplifier 130 amplifies a signal from the analog transmitter circuitry 125 and produces an amplified signal that is transmitted via the transmit antenna 135. In some implementations, analog transmitter circuitry 125 includes the power amplifier 130.

The analog receiver circuitry 150 can receive a signal via a receive antenna 140. The analog receiver circuitry 150 can include modulation circuitry, driven by an oscillator that is tuned to a carrier frequency, to down-convert a signal into a baseband analog signal. An analog to digital interface 155, e.g., an analog to digital convertor (ADC), converts an analog signal from the analog receiver circuitry 150 into a digital signal. The digital baseband processor 105 can process a digital signal from the analog to digital interface 155. For example, the processor 105 can decode a received signal. The analog receiver circuitry 150 can receive an analog receive signal in one of multiple modes such as an operational mode and a predistortion training mode. In an operational mode, a device uses the analog receiver circuitry 150 to receive a signal from a different device. In a predistortion training mode, the device uses the analog receiver circuitry 150 to receive a signal transmitted by the device for determining predistortion parameter values.

The digital predistortion compensator 110 is coupled between the digital baseband processor 105 and the digital to analog interface 120. If activated, the compensator 110 transforms a digital input signal such that the transformed signal counteracts one or more nonlinear characteristics of the power amplifier 130. The digital predistortion compensator 110 uses one or more predistortion parameters that are estimated by a digital predistortion estimation controller 160.

In a training mode, the digital predistortion estimation controller 160 compares a digital transmission signal with a received version of the signal to estimate predistortion parameter values. The digital predistortion estimation controller 160 can include a signal synchronizer and a power normalizer. A signal synchronizer can synchronize a transmission signal with a received version of the transmission signal so that a comparison can be made. A power normalizer can adjust signal strengths (e.g., transmitted signals, received signals, or both) based on one or characteristics of the device.

The controller 160 can activate a loopback of a transmission signal by sending a loopback control signal to the loopback switch circuitry 165. Based on the control signal, the loopback switch circuitry 165 takes the transmission signal from the power amplifier 130 and feeds the signal into the analog receiver circuitry 150. In some implementations, the loopback switch circuitry 165 includes a variable attenuator (not shown). The variable attenuator can attenuate at least a portion of the amplification produced by the power amplifier 130. However, when the device is not required to be in a loopback, the variable attenuator can be set to no attenuation or can be bypassed. In some implementations, the analog receiver circuitry 150 includes loopback switch circuitry 165.

In some implementations, the controller 160 operates the compensator 110 to perform a default transformation during a training period. In some implementations, the controller 160 deactivates the transformation function of the compensator 110 during an initial portion of a training period. After initial digital predistortion values are estimated, the controller 160 can activate the transformation function of the compensator 110. Based on subsequent transmit and receive samples, the controller 160 can iteratively adjust the digital predistortion values until detected nonlinear characteristic, e.g., detected errors, are reduced below a threshold value, which can be a pre-determined value.

In some implementations, the transmit antenna 135 is integrated with the receive antenna 140. In some implementations, the receive antenna 135 is separate from the receive antenna 140. In some implementations, the transmit antenna 135 is one of many transmit antennas. In some implementations, the transmit antenna 135 is one of many receive antennas.

In some implementations, the digital baseband processor 105 is configured to implement the functionality of the digital predistortion compensator 110 and the digital predistortion estimation controller 160. In some implementations, the digital baseband processor 105 includes two or more processor cores. In some implementations, a device includes a system on a chip (SoC). For example, the SoC can include a host processor and a digital signal processor configured as the digital baseband processor 105.

Figure 2:
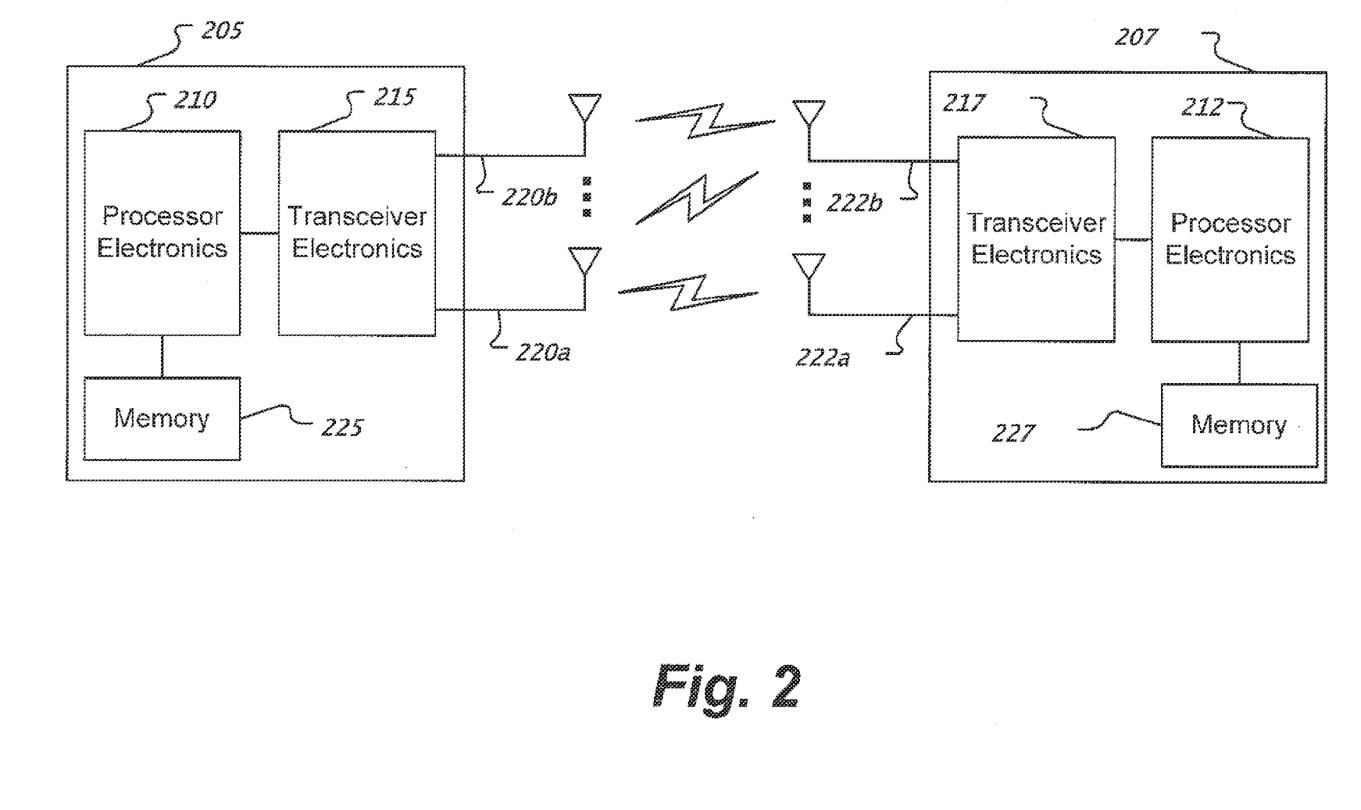
FIG. 2 shows an example of a wireless network with two wireless communication devices.

FIG. 2 shows an example of a wireless network with two wireless communication devices. Wireless communication devices 205, 207 such as an access point (AP), base station (BS), wireless headset, access terminal (AT), client station, or mobile station (MS) can include circuitry such as processor electronics 210, 212. Processor electronics 210, 212 can include one or more processors that implement one or more techniques presented in this disclosure. Wireless communication devices 205, 207 include circuitry such as transceiver electronics 215, 217 to send and receive wireless signals over one or more antennas 220*a*, 220*b*, 222*a*, 222*b*. In some implementations, transceiver electronics 215, 217 include integrated transmitting and receiving circuitry. Wireless communication devices 205, 207 include one or more memories 225, 227 configured to store information such as data, instructions, or both. In some implementations, wireless communication devices 205, 207 include dedicated circuitry for transmitting and dedicated circuitry for receiving.

Figure 3:
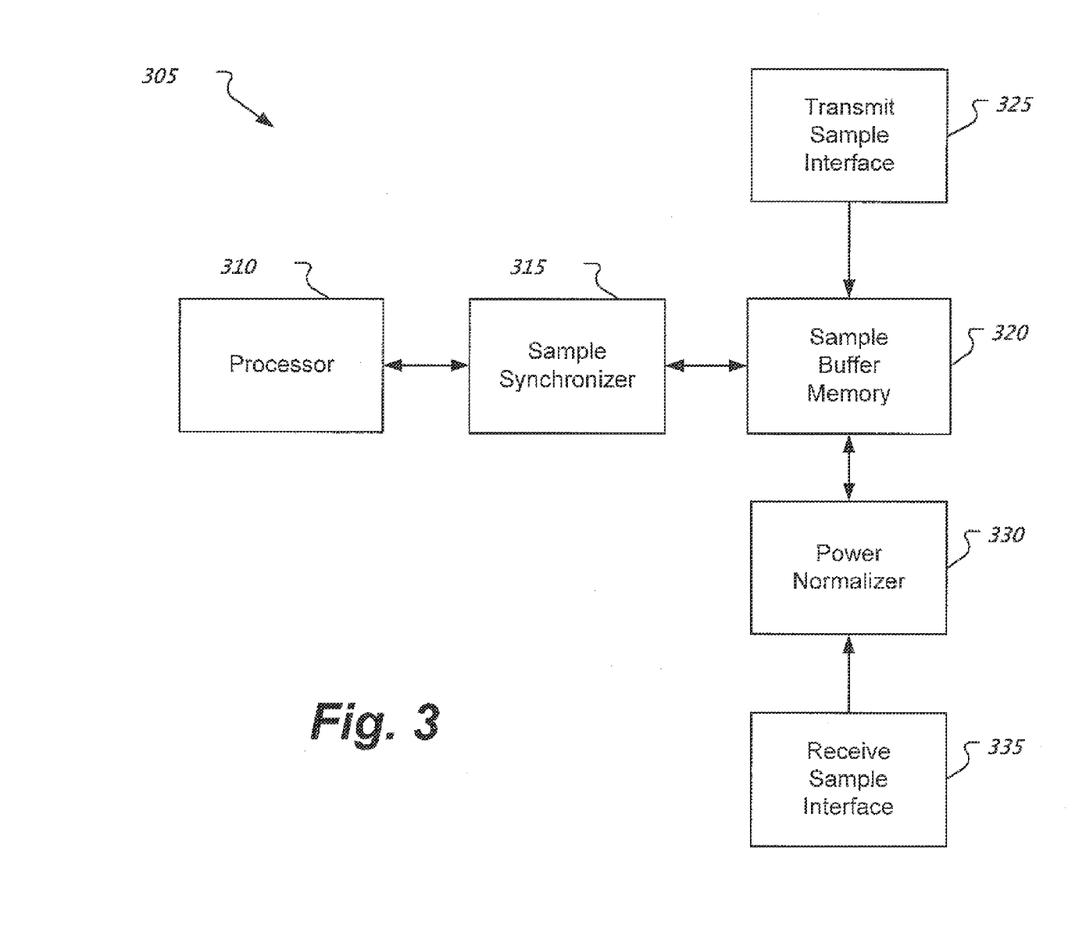
FIG. 3 shows an example of a digital predistortion estimation controller architecture.

FIG. 3 shows an example of a digital predistortion estimation controller architecture. A digital predistortion estimation controller 305 can include a processor 310, sample synchronizer 315, sample buffer memory 320, transmit sample interface 325, power normalizer 330, and receive sample interface 335. The transmit sample interface 325 produces samples of a digital transmit signal and stores them into the sample buffer memory 320. In some implementations, transmit sample interface 325 and a DAC receive the same signal. The receive sample interface 335 produces samples of a digital receive signal and stores them into the sample buffer memory 320. The receive sample interface 335 can sample a digital receive signal produced by an ADC.

If required, the power normalizer 330 can normalize receive samples with respect to transmit samples. The sample synchronizer 315 can align transmit samples with receive samples. The processor 310 can determine predistortion parameter values based on aligned transmit and receive samples. In some implementations, the processor 310 includes the sample synchronizer 315 and the sample buffer memory 320.

Figure 4:
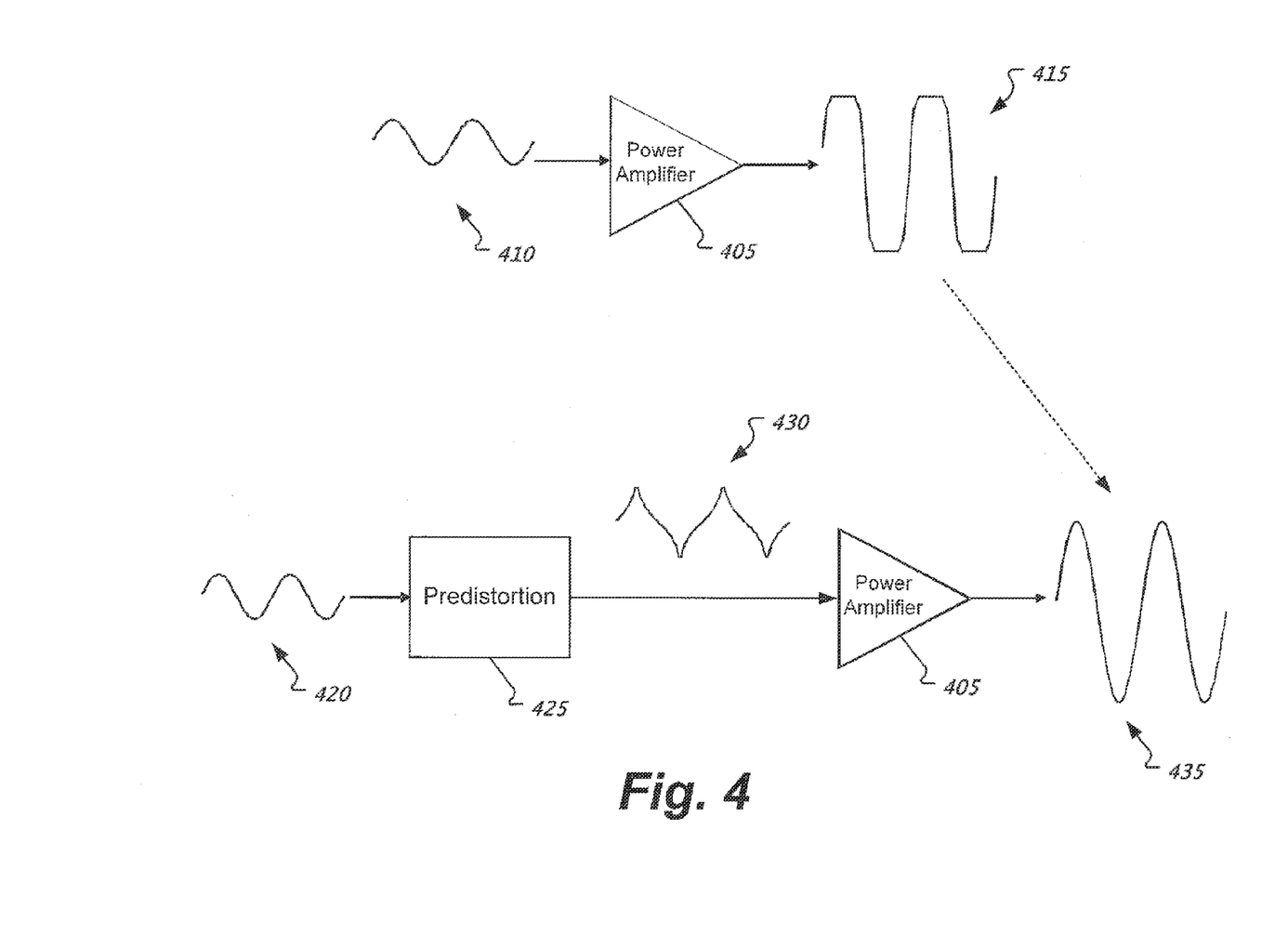
FIG. 4 shows an example of predistortion.

FIG. 4 shows an example of predistortion. A power amplifier 405, having one or more nonlinear characteristics distorts a signal 410 in producing an amplified signal 415. The distorted amplified signal 415, as shown, is clipped at higher amplitudes. However, a predistortion system 425 predistorts a signal 420 to produce a predistored signal 430. The power amplifier 405 amplifies the predistored signal 430 to produce an amplified signal 435. As shown, the amplified signal 435 that is based on predistortion is not clipped.

Figure 5:
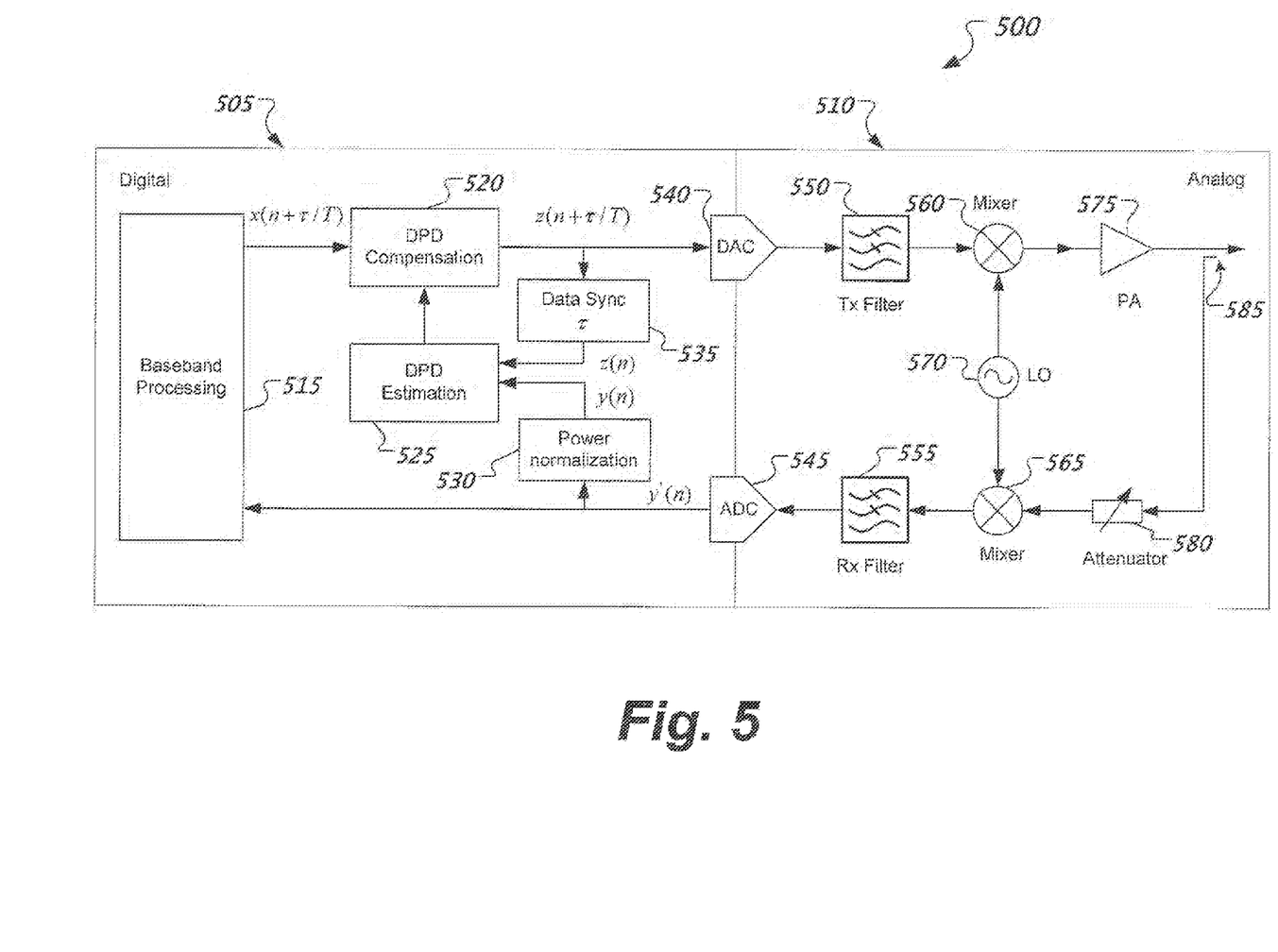
FIG. 5 shows an example of a device that implements digital predistortion.

FIG. 5 shows an example of a device that implements digital predistortion. The device 500 performs digital predistortion estimation and compensation using a digital predistortion compensation module 520 and a digital predistortion estimation module 525. The device 500 can align the power of received signals with the transmitted signals for the estimation of predistortion parameter values via a power normalization module 530. The device 500 can perform synchronization between the transmitted and received signals for the estimation of predistortion parameters via a data sync module 535. For example, a data sync module 535 can determine a sync parameter value $\tau$ for aligning entries in a transmit vector z with entries in a receive vector y.

The device 500 includes digital circuitry 505 such as one or more processors, e.g., digital signal processor or a processor configured to perform signal processing. The device 500 includes a baseband processing module 515 to generate transmission signals and process received signals. The device 500 includes analog circuitry 510 which includes a transmit filter 550, receive filter 555, mixers 560, 565 for signal modulation, oscillator 570, power amplifier 575, attenuator 580 such as a variable attenuator, and a radio frequency (RF) coupler 585. The device 500 includes a DAC 540 and an ADC 545 to interface signals between digital circuitry 505 and analog circuitry 510.

The device 500 can perform digital predistortion estimation and compensation in the digital domain using transmitted and received signals as input. A digital predistortion estimation technique can use an algorithm such as Recursive Lease Squares (RLS) or Least Mean Squares (LMS) to estimate one or more predistortion parameter values. In some implementations, a digital predistortion technique does not require prior knowledge of (e.g., is agnostic to) one or more signal characteristics such as modulation type, baseband frequency, and intermediate frequency.

A digital predistortion technique can be incorporated with a power control mechanism such as an adaptive power control mechanism. Based on a size of the change in power, the device 500 can trigger digital predistortion training.

The device 500 can include an attenuator 580 to eliminate or reduce receiver saturation when a transmission signal is looped back through the receiver circuitry via a RF coupler 585. Inputs to the digital predistortion estimation module 525 include the input to the DAC 540 and the output of the ADC 545. In some implementations, the digital predistortion compensation module 520 provides a digital transmit signal directly to the DAC 540.

In some implementations, the bandwidth of the transmit filter 550 is at least two times that of a signal bandwidth to allow passage of predistorted signals. For example, transmit filter 550 bandwidth is required to be large enough to accommodate the predistorted signal spectrum. In some implementations, a bandwidth of the receive filter 555 is at least wide enough to pass through signals distorted by one or more nonlinear characteristics of the power amplifier 575. For example, the bandwidth of the receive filter 555 is at least two times that of a signal bandwidth to allow passage of predistorted signals. In a predistortion training mode, the receive filter 555 can be reconfigured to have wider bandwidth or to be bypassed.

In some implementations, the nonlinearity produced by the power amplifier 575 is significantly greater than any nonlinearity caused within the receiver circuitry such as the attenuator 580, mixer 565, or receive filter 555. In some implementations, a device 500 includes an automatic gain controller (AGC) to minimize or eliminated a nonlinear contribution from the receiver circuitry.

Figure 6:
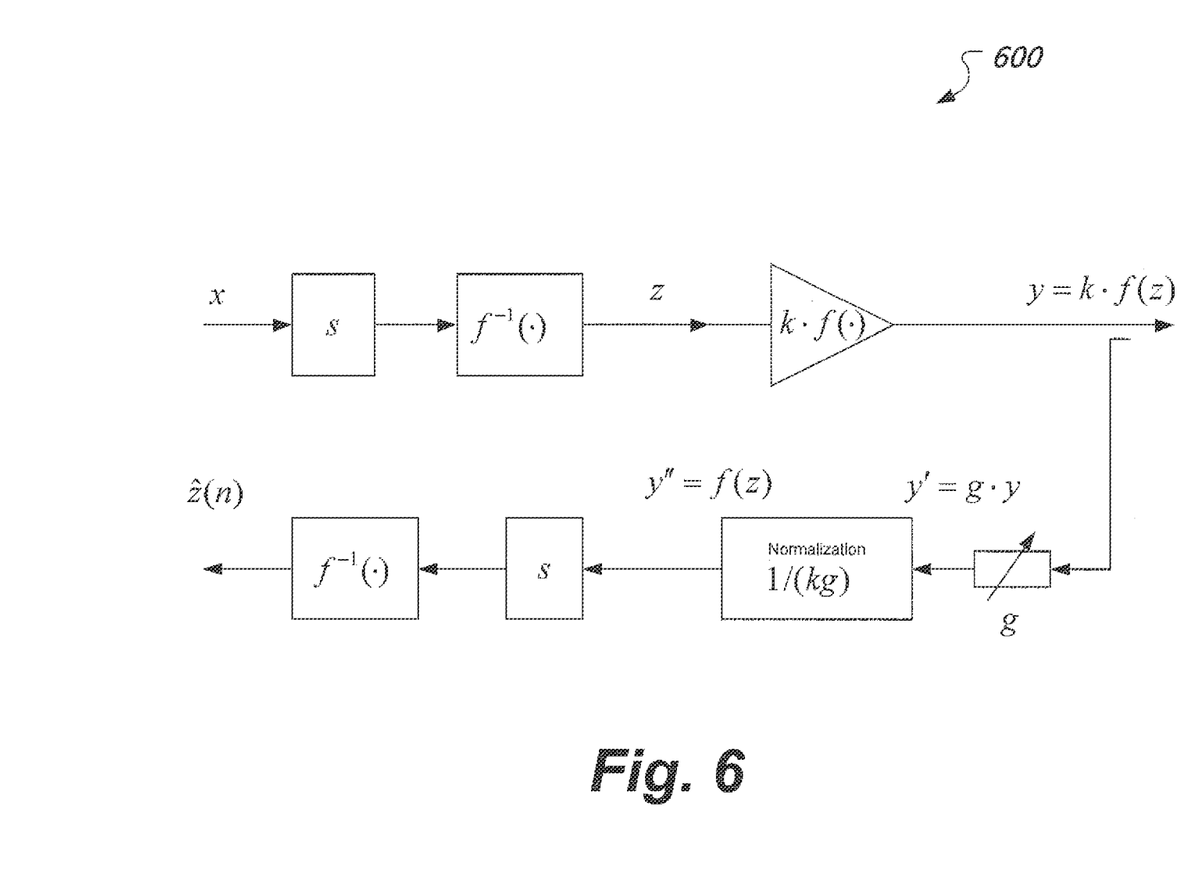
FIG. 6 shows an example of a digital predistortion architecture annotated with power normalization parameters.

FIG. 6 shows an example of a digital predistortion architecture annotated with power normalization parameters. In the digital predistortion architecture 600, digital predistortion is based on unity gain, where the function $f(\cdot)$ has unity gain, e.g., $\sigma(f(z))=\sigma(z)$. Power normalization parameters such as k and g denoted transmit and receive loop gain respectively. A digital gain is represented by s. Vectors x, z, and y represent data points of a digital transmit signal, analog predistorted signal, and analog amplified transmit signal respectively. The power normalization module 530 normalizes the power of a received signal to that of a transmitted signal. In some implementations, transmit power control is required to be performed before digital predistortion compensation. Digital predistortion can increase the peak-to-average power ratio of an input signal. The device 500 can perform a digital back-off of the original input signal.

The digital predistortion estimation module 525 can use a predistortion model as follows:

$$z(n) = \sum_{k=0}^{K} \sum_{q=0}^{Q} \theta_{k,q} \Psi_k(y(n-q)) \tag{1}$$

where y(n) is an output sample, $\Psi_k(y(n))$ is a nonlinear form of an input sample, and $\theta_{k,q}$ are the coefficients to estimate. Here, parameters K and Q represent a polynomial order and a memory order, respectively. The (K, Q) parameters can take on values such as (3,0), (3,1), (5,0), and (5,1). The estimation module 525 can use an odd-order polynomial model. Various examples of odd-order polynomial models include $$\Psi_{2k+1}(y(n)) = |y(n)|^{2k} y(n) \tag{2}$$

and $$\Psi_{2k+1}(y(n-q)) = |y(n-q)|^{2k} y(n-q). \tag{3}$$

The polynomial-based nonlinear predistortion model is linear to the model coefficients.

In some implementations, a device 500 can use least squares technique to estimate predistortion parameters such as model coefficients. To estimate model parameters of equation (3), the device 500 can solve the equation:

$$\min_{\theta} S(\theta) = \sum_{i=1}^{n} |y_i - x_i \theta|^2. \tag{4}$$

In some implementations, a device 500 can use a least mean squares technique to estimate predistortion parameter values such as model coefficients. To estimate model parameters of equation (3), the device 500 can solve the equation:

$$\min_{\theta} S(\theta) = E\|y_i - x_i \theta\|^2. \tag{5}$$

In some implementations, a device 500 can use a matrix based least squares technique to estimate model coefficients. For example, the device 500 can solve the equation:

$$\sum_{i=1}^{n} |y_i - x_i\theta|^2 = (Y - X\theta)^H(Y - X\theta). \quad (6)$$

In equation (6), $y_i \epsilon C^{1\times 1}$ is a scalar, $x_i \epsilon C^{1\times r}$ and $\theta \epsilon C^{r\times 1}$ are vectors, where notation $C^{m\times n}$ above represents a complex matrix space with m·n dimensions. T represents a transpose operator, whereas H represents a Hermitian transpose operator. Note that n, r denote number of data samples for training and number of training coefficients, respectively, with values such as n=1000 and r=3, for example.

$$Y = \begin{bmatrix} y_1 \\ y_2 \\ \vdots \\ y_n \end{bmatrix}, X = \begin{bmatrix} x_1 \\ x_2 \\ \vdots \\ x_n \end{bmatrix}.$$

The Moore-Penrose pseudo-inverse of A is $A^+$. If the columns of A are linearly independent, then $A^+ = (A^H A)^{-1} A^H$. A least squares solution to equation (6) is given by:

$$\theta = X^+ Y = (X^H X)^{-1} X^H Y \quad (7).$$

In some implementations, a device 500 can use a matrix based recursive least squares (RLS) technique to estimate model coefficients. For example, the device 500 can solve the equations:

$$P(n) = \left(I - \frac{P(n-1)x_n^H x_n}{1 + x_n P(n-1)x_n^H}\right) P(n-1) \quad (8)$$

$$\theta(n) = \theta(n-1) + \frac{P(n-1)x_n^H}{1 + x_n P(n-1)x_n^H}(y_n - x_n\theta(n-1)) \quad (9)$$

where $P(0)=\delta I$ and $\theta(0)=[0\ 0\ \ldots\ 0]$.

In some implementations, a device 500 can use a matrix based least mean squares (LMS) technique to estimate model coefficients. For example, the device 500 can solve the equation:

$$\theta(n) = \theta(n-1) + \mu(y_n - x_n\theta(n-1))x_n^H \quad (10)$$

where $\theta(0)=[0\ 0\ \ldots\ 0]^T$ and step size $\mu > 0$.

Figure 7:
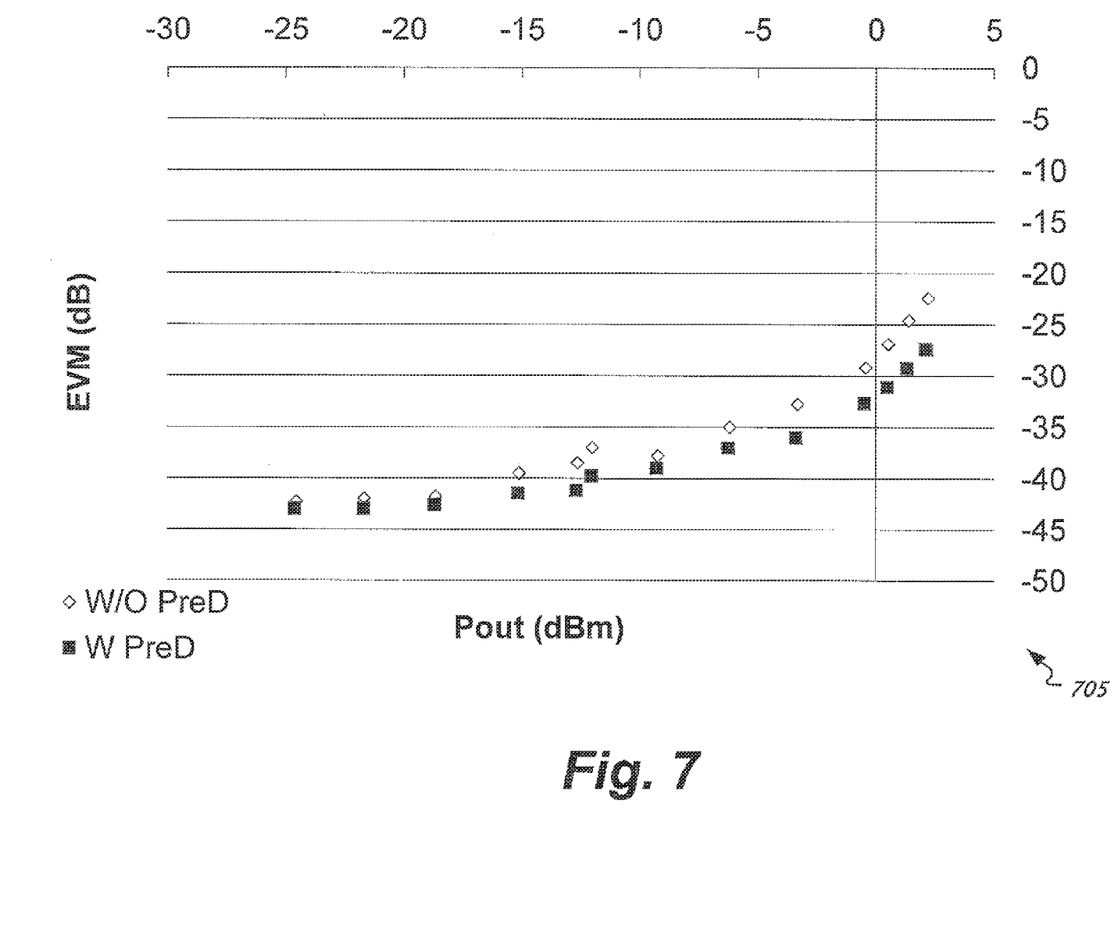
FIG. 7 shows an example of a performance based graph of a described digital predistortion technique.

FIG. 7 shows an example of a performance based graph of a described digital predistortion technique. In this example, a wireless communication device is configured for WiMAX communications based on a 10 MHz bandwidth with calibrated DC offset and I/Q mismatch. The analog transmit filter has an 18 MHz bandwidth. The analog receive filter has an 18 MHz bandwidth. The transmit and receive signal sampling rate is 89.6 MHz. The predistortion model uses a 5th odd-order memory-less polynomial model. The device uses a RLS algorithm to estimate predistortion parameters and uses 100,000 samples for the estimation. The graph 705 shows the performance with digital predistortion (labeled as "W PreD") and without digital predistortion (labeled as "W/O PreD"). As shown by the graph 705, in the nonlinearity dominated operating points (e.g., EVM>−30 dB), the digital predistortion technique in this example provides 3~5 dB of EVM improvements. Lower EVM operating points, e.g., lower EVM values, indicate better performance. Especially at higher power outputs (e.g., higher $P_{out}$ points), a device using the digital predistortion technique in this example provides better performance than a device that does not use digital predistortion. In noise dominated operating points (e.g., EVM<−30 dB), digital predistortion technique in this example does not degrade EVM.

In some implementations, a predistortion model is based on a memory-full polynomial model. In such a model, the Q parameter of equation (1) is based on one or more memory effects from the power amplifier. For example, a value for Q is large enough to be able to cause the model to estimate and compensate for some or all of the memory effects from a power amplifier. In some implementations, a memory-full predistorter selects a value for Q based on output from the power amplifier. In some implementations, a memory-full predistorter is configured to have a pre-determined value for Q.

Figure 8:
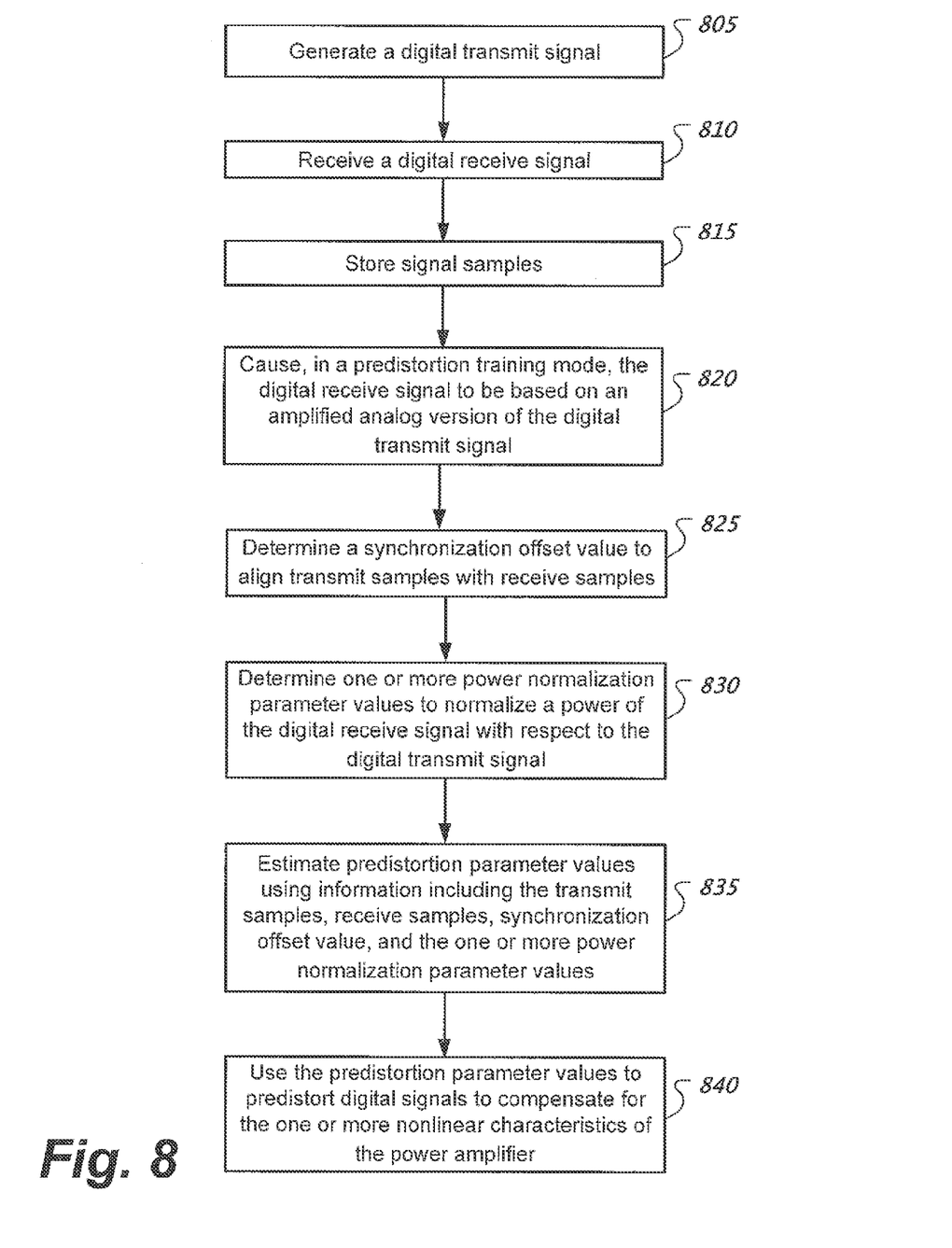
FIG. 8 shows an example of a communication process that includes digital predistortion estimation and compensation.

FIG. 8 shows an example of a communication process that includes digital predistortion estimation and compensation. Processor electronics such as a baseband processor can perform one or more communication processes. At 805, the communication process includes generating signals such as a digital transmit signal. For example, a baseband processor can prepare data received from a host processor for over the air transmission. In another example, generating signals includes generating a training signal for predistortion training.

At 810, the communication process includes receiving signals such as a digital receive signal. A baseband processor can process digital signals that are based on signals received over the air. In a predistortion training mode, the baseband processor can process digital signals that are based on an amplified analog version of the digital transmit signal.

At 815, the communication process includes storing signal samples. The signal samples can include transmit samples based on a digital transmit signal. The signal samples can include receive samples based on a digital receive signal. In some implementations, signal samples, such as transmit samples and receive samples, are complex numbers.

At 820, the communication process includes causing, in a predistortion training mode, the digital receive signal to be based on an amplified analog version of the digital transmit signal. In some implementations, an amplified analog version is produced by a power amplifier having one or more nonlinear characteristics. In some implementations, the communication process includes controlling, in the predistortion training mode, an attenuator to attenuate the amplified analog version to avoid saturating receiver circuitry. In some implementations, the process includes sending a signal to control loopback circuitry to loop a transmit signal back into receiver circuitry.

At 825, the communication process includes determining a synchronization offset value to align transmit samples with receive samples. Determining a synchronization offset value can include the matching of a known transmit pattern to at least a portion of the received data. In some implementations, determining a synchronization offset value includes performing a correlation operation based on at least a portion of the transmit samples and the receive samples.

At 830, the communication process includes determining one or more power normalization parameter values to normalize a power of the digital receive signal with respect to the digital transmit signal. Such normalization can cause the received signal to have the same power as the transmit signal.

At 835, the communication process includes estimating predistortion parameter values using information comprising the transmit samples, receive samples, synchronization offset value, and the one or more power normalization parameter values. The communication process can use the synchronization offset value to offset a sample index value to match a transmit sample with a corresponding receive sample. The communication process can use the normalization parameter values to adjust a power of the digital receive signal. In some implementations, the communication process can cause receiver circuitry to use the normalization parameter values to adjust a power before conversion into a digital receive signal.

Estimating predistortion parameter values can include using a polynomial based nonlinear predistortion model that is linear to the predistortion parameter values. In some implementations, the predistortion parameter values are complex numbers. Estimating the predistortion parameter values can include using a recursive estimation technique to iteratively produce updated versions of the predistortion parameter values. For example, a RLS estimation technique can iteratively produce model coefficients. In some implementations, the process includes estimating updated versions of the predistortion parameter values based on a power change of the digital transmit signal.

At 840, the communication process includes using the predistortion parameter values to predistort digital signals to compensate for the one or more nonlinear characteristics of the power amplifier. Predistorting a digital signal can include causing a signal to go through a predistortion block characterized by the predistortion parameter. A predistortion block forms an inverse function of power amplifier. For example, a signal passing through a predistortion block followed by a power amplifier yields minimal or no distortion, because the predistortion block and the non-linear behavior of the power amplifier effectively cancel each other.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A system, comprising:
   processor electronics configured to produce a digital transmit signal;
   a first convertor to convert the digital transmit signal to an analog transmit signal;
   a power amplifier to amplify the analog transmit signal to produce an amplified analog transmit signal, wherein the power amplifier has one or more nonlinear characteristics;
   receiver circuitry to receive an analog receive signal in different modes comprising an operational mode and a predistortion training mode, the receiver circuitry being configured to receive the amplified analog transmit signal as the analog receive signal in the predistortion training mode;
   a second convertor to convert the analog receive signal to a digital receive signal; and
   a receive filter coupled between the receiver circuitry and the second convertor, wherein the receive filter is configured to operate at a first bandwidth during the operational mode and operate at a second bandwidth during the predistortion training mode, and the second bandwidth being wider than the first bandwidth,
   wherein the processor electronics are configured to (i) operate the system in the predistortion training mode to gather information to estimate one or more predistortion parameter values, and (ii) use the one or more predistortion parameter values to predistort digital signals to compensate for the one or more nonlinear characteristics of the power amplifier when operating in the operational mode, wherein the information comprises transmit samples that are based on the digital transmit signal and receive samples that are based on the digital receive signal.

2. The system of claim 1, wherein the processor electronics are configured to estimate updated versions of the one or more predistortion parameter values based on a power change of the digital transmit signal.

3. The system of claim 1, wherein the processor electronics are configured to perform operations comprising:
determining a synchronization offset value to align the transmit samples with the receive samples;
determining one or more power normalization parameter values to normalize a power of the digital receive signal with respect to the digital transmit signal; and
estimating the one or more predistortion parameter values using information comprising the transmit samples, the receive samples, the synchronization offset value, and the one or more power normalization parameter values.

4. The system of claim 3, wherein estimating the one or more predistortion parameter values comprises using a polynomial based nonlinear predistortion model that is linear to the one or more predistortion parameter values, and wherein the transmit samples, the receive samples, and the one or more predistortion parameter values are represented by complex numbers.

5. The system of claim 3, wherein estimating the one or more predistortion parameter values comprises using a recursive estimation technique to iteratively produce updated versions of the one or more predistortion parameter values.

6. The system of claim 1, further comprising:
a transmit filter coupled between the first convertor and the power amplifier, wherein a bandwidth of the transmit filter is at least twice that of the digital transmit signal.

7. The system of claim 1, wherein the second bandwidth of the receive filter is at least wide enough to pass through signals distorted by the one or more nonlinear characteristics of the power amplifier.

8. The system of claim 1, wherein the receiver circuitry comprises an attenuator to attenuate the analog receive signal when the system is operating in the predistortion training mode.

9. The system of claim 1, wherein the receiver circuitry comprises an automatic gain controller to compensate for one or more nonlinear characteristics of the receiver circuitry.

10. A method, comprising:
operating a device, that includes a receive filter, in different modes comprising an operational mode and a predistortion training mode, wherein the receive filter is configured to operate at a first bandwidth during the operational mode and operate at a second bandwidth during the predistortion training mode, the second bandwidth being wider than the first bandwidth;
generating a digital transmit signal;
receiving a digital receive signal via circuitry that comprises the receive filter;
causing, in the predistortion training mode, the digital receive signal to be based on an amplified analog version of the digital transmit signal, wherein the amplified analog version is produced by a power amplifier having one or more nonlinear characteristics;
storing signal samples responsive to the device being in the predistortion training mode, the signal samples including transmit samples based on the digital transmit signal and receive samples based on the digital receive signal;
estimating one or more predistortion parameter values using information comprising the transmit samples and the receive samples; and
using the one or more predistortion parameter values to predistort digital signals to compensate for the one or more nonlinear characteristics of the power amplifier.

11. The method of claim 10, comprising:
estimating updated versions of the one or more predistortion parameter values based on a power change of the digital transmit signal.

12. The method of claim 10, comprising:
determining a synchronization offset value to align the transmit samples with the receive samples; and
determining one or more power normalization parameter values to normalize a power of the digital receive signal with respect to the digital transmit signal,
wherein estimating the one or more predistortion parameter values comprises using the synchronization offset value and the one or more power normalization parameter values.

13. The method of claim 10, wherein estimating the one or more predistortion parameter values comprises using a polynomial based nonlinear predistortion model that is linear to the one or more predistortion parameter values, and wherein the one or more predistortion parameter values are represented by complex numbers.

14. The method of claim 10, wherein estimating the one or more predistortion parameter values comprises using a recursive estimation technique to iteratively produce updated versions of the one or more predistortion parameter values.

15. The method of claim 10, comprising:
controlling an attenuator to attenuate the amplified analog version when the device is operating in the predistortion training mode.

16. A non-transitory computer-readable medium embodying a program operable to cause a device to perform operations, the operations comprising:
causing the device, that comprises a receive filter, to operate in different modes comprising an operational mode and a predistortion training mode, wherein the receive filter is configured to operate at a first bandwidth during the operational mode and operate at a second bandwidth during the predistortion training mode, the second bandwidth being wider than the first bandwidth;
generating a digital transmit signal;
receiving a digital receive signal via circuitry that comprises the receive filter;
causing, in the predistortion training mode, the digital receive signal to be based on an amplified analog version of the digital transmit signal, wherein the amplified analog version is produced by a power amplifier having one or more nonlinear characteristics;
storing signal samples responsive to the device being in the predistortion training mode, the signal samples including transmit samples based on the digital transmit signal and receive samples based on the digital receive signal;
estimating one or more predistortion parameter values using information comprising the transmit samples and the receive samples; and
using the one or more predistortion parameter values to predistort digital signals to compensate for the one or more nonlinear characteristics of the power amplifier.

17. The medium of claim 16, the operations comprising:
estimating updated versions of the one or more predistortion parameter values based on a power change of the digital transmit signal.

18. The medium of claim 16, the operations comprising:
determining a synchronization offset value to align the transmit samples with the receive samples; and
determining one or more power normalization parameter values to normalize a power of the digital receive signal with respect to the digital transmit signal,
wherein estimating the one or more predistortion parameter values comprises using the synchronization offset value and the one or more power normalization parameter values.

19. The medium of claim 16, wherein estimating the one or more predistortion parameter values comprises using a polynomial based nonlinear predistortion model that is linear to the one or more predistortion parameter values, and wherein the one or more predistortion parameter values are represented by complex numbers.

20. The medium of claim 16, wherein estimating the one or more predistortion parameter values comprises using a recursive estimation technique to iteratively produce updated versions of the one or more predistortion parameter values.

* * * * *